Figure 1:
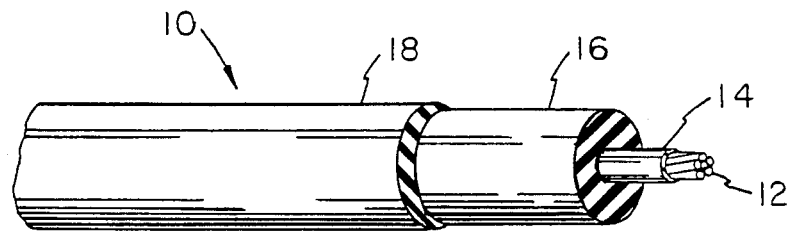

United States Patent [19]

Walton

[11] Patent Number: 4,571,544

[45] Date of Patent: Feb. 18, 1986

[54] MICROWAVE EXAMINATION OF SEMICONDUCTIVE SHIELDS

[75] Inventor: Mark D. Walton, Hallsville, Tex.

[73] Assignee: Aluminum Company of America, Pittsburgh, Pa.

[21] Appl. No.: 550,378

[22] Filed: Nov. 10, 1983

[51] Int. Cl.[4] .......................................... G01R 27/04
[52] U.S. Cl. ............................................... 324/58.5 R
[58] Field of Search ................. 324/58.5 C, 58 C, 51, 324/58.5 B, 58.5 R; 264/22, 40.2

[56] References Cited

U.S. PATENT DOCUMENTS

| | | | |
|---|---|---|---|
| 2,548,598 | 4/1951 | Feiker, Jr. | 324/58.5 C |
| 2,792,548 | 5/1957 | Hershberger | 324/58.5 C |
| 3,233,172 | 2/1966 | Luoma | 324/58.5 B |
| 3,458,808 | 7/1969 | Agdur | 324/58.5 C |
| 3,739,263 | 6/1973 | Henoch | 324/58.5 C |
| 3,995,212 | 11/1976 | Ross | 324/58.5 B |
| 4,103,224 | 7/1978 | Taro et al. | 324/58.5 C |
| 4,297,874 | 11/1981 | Sasaki | 324/58.5 C X |

Primary Examiner—Stanley T. Krawczewicz
Attorney, Agent, or Firm—Elroy Strickland

[57] ABSTRACT

A method of continuously and uniformly examining a semiconductor shield of an electrical cable. The method includes the step of providing a cavity structure capable of supporting a relatively high order coaxial mode of microwave energy at a relatively high quality factor when the cavity is dielectrically unloaded. Microwave energy is directed to the cavity in a manner that excites the high order mode, and a cable having a semiconductor shield is continuously directed through the cavity structure. The semiconductive material loads the cavity structure and thereby changes the quality factor thereof. The loading of the structure and the changing quality factor thereof are continuously monitored to provide an indication of changes in the integrity of the semiconductive shield.

2 Claims, 2 Drawing Figures

MICROWAVE EXAMINATION OF SEMICONDUCTIVE SHIELDS

BACKGROUND OF THE INVENTION

The present invention relates generally to examining insulated electrical conductors of the type having either a semiconductive layer provided on a central core of stranded wire, or a conductor having a second layer of semiconductor material disposed on the outer surface of a relatively thick jacket of insulating material located on the first semiconductive layer.

In U.S. Pat. No. 4,260,566 to Brouwer et al, an apparatus is shown for detecting imperfections in a semiconductive shield applied to an electrical conductor. An AC current is applied between a bare portion of the conductor and apparatus applying a jacket of insulating material over the strand shield as the conductor and shield move through the apparatus. The impedance of the conductor and apparatus is measured to provide an indication of changes in the quality of the strand shield applied to the conductor.

U.S. Pat. No. 2,548,598 to Feiker discloses the use of a cavity with two, opposed chokes for measuring imperfections on the surface of a bare metal wire directed through the chokes and cavity. Resistive flaws impede surface currents along the wire and inside the chokes, which lower the Q of the resonant cavity, i.e., the cavity appears more lossy. The wire in the chokes forms a coaxial transmission line, the characteristic impedance of which is changed by nicks on the wire surface, which detunes the cavity.

U.S. Pat. No. 3,739,263 to Henoch discloses the use of a cavity structure, designed to resonate at two distinct frequencies, to measure the thickness of a dielectric layer on a metal wire. A swept frequency oscillator feeds the cavity while a first detector measures the diameter of the wire before the layer is applied and a second detector measures the diameter of the wire after the layer is applied. The two diameters affect the two resonant frequencies in the respective cavities in a manner that provides an indication of the thickness of the layer.

BRIEF SUMMARY OF THE INVENTION

The present invention is directed to a method of determining imperfection or defects in a semiconductor shield of an insulated electrical conductor by using a cavity structure capable of supporting a relatively high order coaxial mode of microwave energy at a high quality of resonance, i.e., at a high Q factor when the cavity is dielectrically unloaded. A cable having at least one layer of semiconductive material is continuously directed through the cavity, the semiconductive material providing dielectric losses in the cavity such that the cavity is loaded and the quality of resonance reduced. Means are provided for continuously monitoring the degree of loading and reduced resonance to determine any changes in the semiconductive layer that might indicate imperfections or defects in the layer.

The cable is directed through the center of the cavity and through the center of an electric field of the microwave energy. The cable is therefore completely surrounded by the energy such that 100% of the semiconductive layer is examined on a continuous and very rapid basis.

THE DRAWINGS

Figure 2:
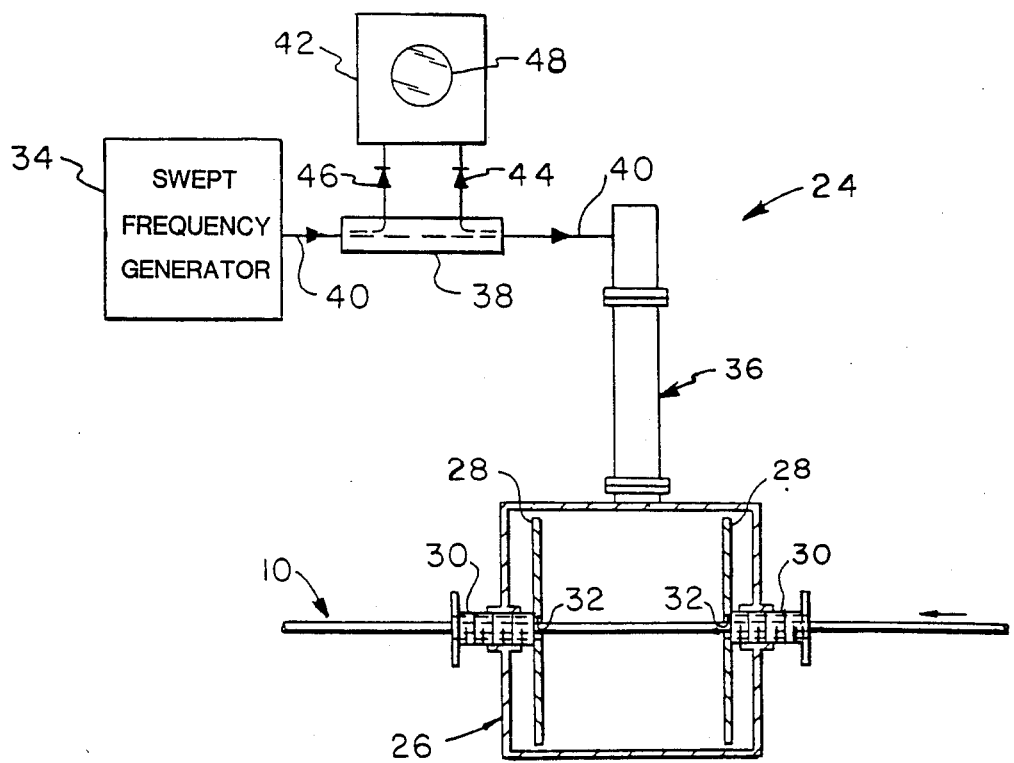

The invention, along with its objectives and advantages, will be best understood from consideration of the following detailed description and the accompanying drawings in which:

FIG. 1 is an isometric view of a portion of a cable that has been cut away to expose the components thereof, and FIG. 2 is a diagrammatic representation of a cavity structure and feed system for examining the cable of FIG. 1.

PREFERRED EMBODIMENT OF THE INVENTION

Referring now to the drawings, FIG. 1 thereof shows portions of an insulated electrical cable 10 cut away to expose the components thereof. The cable shown is of the type cable of handling high, primary voltages, i.e., 15 to 35 kv. Such a cable has a core of stranded wires 12, a thin layer 14 of semiconducting material, known as a "strand shield", a relatively thick jacket 16 of insulating polymer material, and a second, thin layer 18 of semiconducting material disposed on jacket 16. Layer 18 is known as an "insulation shield".

Another type of cable is the "secondary voltage cable", which is designed to handle distribution voltages, i.e., 600 volts. This type of cable usually has only a single layer of insulation that is somewhat thinner than the insulating jacket 16 that is employed in a primary type cable. It, however, is lossy at microwave frequencies because it employs carbon fillers for protection against degradation due to UV exposure.

FIG. 2 of the drawings shows diagrammatically apparatus 24 for rapidly examining the shields of distribution and primary cables in a completely uniform manner. More particularly, 24 comprises a metal cavity structure 26 having opposed metal plungers 28 mechanically connected to respective hollow bushings 30 threaded in the end walls of the cavity. The bushings are hollow and have an internal diameter that is greater than the outer diameter of the largest cable (10) to be examined by apparatus 24. Each plunger is provided with an opening 32 of size corresponding to that of the bushings, with the bushings being attached to plungers at the location of openings 32 such that a cable can be directed through the bushings and openings.

To provide cavity 26 with electromagnetic energy, a low power (less than 10 millivolts) swept frequency generator 34 is employed. The output of the generator is shown connected to a rectangular (in cross section) waveguide 36 via a dual-directional coupler 38. Coaxial cables 40 (only diagrammatically shown) can be employed to direct the output of the swept frequency generator to the coupler and from the coupler to the waveguide.

Waveguide 36 pipes the energy from generator 34 to cavity 26 in a manner that provides the same with a high order, such as a $TE_{111}$ or $TE_{011}$, coaxial mode of microwave energy when the frequency range of the swept frequency generator encompasses a frequency at which the cavity is resonant. The resonant frequency of the cavity can be changed by rotation of bushings 30; 30 translate tuning plungers 28 along the longitudinal axis of the cavity such that the length dimension of the cavity is increased or decreased.

To examine the integrity of the strand shield of a low voltage cable or the strand and insulation shields of a primary cable, the cable is directed through the cavity via bushings 30 and the openings 32 provided in plungers 28. The sizes of the openings in the bushings and plungers are such that they accommodate the cable to be examined but "cut off" the electromagnetic energy within the cavity at the openings to prevent escape of the energy from the structures of the bushings and cavity.

At an appropriate excitation frequency, cavity 26 propagates the microwave energy in a transverse electric (TE) mode within the cavity when the center conductor 12 of cable 10 extends through the radial center of the cavity structure. The above $TE_{111}$ mode is preferred for examining both strand and insulation shields 14 and 18 or the strand shield 14 alone, as the electric (E) field generated by this mode is normal to the axes of the cable and shields in the cavity and is rotationally symmetric about the cable and shields with appropriate feed of the electromagnetic energy to the cavity. (The numerical subscripts refer to the number of electric field variations in the directions of the standard cylindrical coordinates, i.e., circumferential, radial and axial. The $TE_{111}$ nomenclature then indicates that the field has one variation in the directions of the three axes.)

The cable examining process functions in the following manner. When the shield or shields of cable 10 enter cavity 26, carbon material of the shield or shields dielectrically loads the cavity and reduces the quality (Q) of the resonance of the cavity. With an unloaded high Q cavity, little or no energy is reflected back to the coupler and to a set of crystal diodes 44 and 46 connected between the coupler and an oscilloscope 42. When a "lossy" material such as carbon enters the cavity, however, there is a deterioration in Q and a change in the energy reflected back to the diodes. The diodes sense the increase in reflected energy and direct this information to oscilloscope 42. The information appears as a trace (not shown) on the screen (48) of the oscilloscope.

As conductor 10 travels through cavity 26, crystal detector 44 continuously applies a signal to oscilloscope 42 that represents the ratio of power reflected from the cavity to power entering the cavity over the frequency range of the swept frequency generator. Quality factor (Q) of the cavity is determined from the shape of the trace on the screen of the oscilloscope. Dual-directional coupler 38 permits the energy from the generator to travel to the cavity and detector 46 while simultaneously directing reflected energy from the cavity to detector 44. If the integrity of the shield or shields is sound, a certain amount of steady state energy is reflected; the screen of the oscilloscope provides a corresponding trace that is steady state for any given instant of time as the cable passes through the cavity. However, if a skip or hole occurs in one or both of the shields, the electrical field in the cavity is momentarily affected, i.e., the field sees the absence of lossy material which instantly increases the Q of the cavity and hence changes the power reflected to the detectors. This is sensed by detectors 44 and 46 which change the steady state trace on the oscilloscope.

Since the electrical field extends uniformly around and into the cable, it is able to examine the entire shield or shields in a uniform, rapid and continuous manner without concern for any orientation of the defect. And since the field penetrates the outer shield and/or the insulating jacket to the inner shield, the apparatus of the invention does not require a skip or defect in the shield to be visible, as is the case for optical examination of cable.

If it is desired to examine primarily the outer insulation shield of a cable, a $TE_{011}$ excitation mode is preferred. Such a mode provides an electric field that is cylindrical and tangential to and rotationally symmetric about the cable in cavity 26. However, to satisfy Maxwell's equations, the tangential E field must vanish at the boundaries of the coaxial structure, which is the outer wall of cavity 26 and the central conductor 12 of the cable. Hence, the strand shield 14 does not load the cavity in a substantial manner. However, the insulation shield 18 does load the cavity in the $TE_{011}$ mode, and is in fact the best mode for detecting skips in the insulation shield. This is because the Q of a resonant cavity is two to three times greater for the $TE_{011}$ mode than the $TE_{111}$ mode.

In addition, since there is essentially no tangential field in the immediate vicinity of the outer wall of the cavity with the $TE_{011}$ mode, no flow of current occurs along the inner surfaces of the wall, and no current flows across the gaps between the tuning plungers 28 and the end walls of the cavity. The plungers are therefore free to move for adjustment of the cavity without the possibility of arcing occurring across the gaps.

While the invention has been described in terms of preferred embodiments, the claims appended hereto are intended to encompass all embodiments which fall within the spirit of the invention.

What is claimed is:

1. A method of continuously examining the semiconductive shield of an electrical power cable in a uniform manner, the method comprising the steps of:
providing a cavity structure capable of supporting a relatively high order coaxial mode of microwave energy at a relatively high quality factor when the cavity is dielectrically unloaded,
providing a source of microwave energy,
directing incident microwave energy to the cavity structure in a manner that excites the high order coaxial mode of the energy in the structure,
continuously directing the cable structure having at least one semiconductive shield through the cavity structure, the semiconductive material of the shield dielectrically loading the cavity structure and thereby changing the quality factor thereof such that microwave energy is reflected from the cavity,
continuously monitoring the degree of dielectric loading in the cavity structure and thus the quality factor thereof by measuring the ratio of reflected and incident energy from the cavity, and
noting any changes in said ratio.

2. The method of claim 1 including the step of providing two crystal detectors and an oscilloscope to monitor the quality factor of the cavity structure.

* * * * *